(12) United States Patent
Kong et al.

(10) Patent No.: US 12,413,193 B2
(45) Date of Patent: Sep. 9, 2025

(54) RAIL-TO-RAIL CLASS-AB BUFFER AMPLIFIER WITH COMPACT ADAPTIVE BIASING

(71) Applicant: RESEARCH & BUSINESS FOUNDATION SUNGKYUNKWAN UNIVERSITY, Suwon-si (KR)

(72) Inventors: Bai-Sun Kong, Suwon-si (KR); Chang Ho An, Anyang-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 424 days.

(21) Appl. No.: 17/894,648

(22) Filed: Aug. 24, 2022

(65) Prior Publication Data
US 2023/0073318 A1 Mar. 9, 2023

(30) Foreign Application Priority Data
Aug. 25, 2021 (KR) .................. 10-2021-0112571

(51) Int. Cl.
*H03F 3/45* (2006.01)
*H03F 3/30* (2006.01)

(52) U.S. Cl.
CPC ..... *H03F 3/45183* (2013.01); *H03F 3/45273* (2013.01); *H03F 3/3022* (2013.01); *H03F 2203/45248* (2013.01)

(58) Field of Classification Search
CPC ............. H03F 3/45183; H03F 3/45273; H03F 2203/45248; H03F 2203/45112;
(Continued)

(56) References Cited

U.S. PATENT DOCUMENTS 7,102,436 B2 * 9/2006 Sung ................... H03F 3/45192
330/255
7,576,610 B2 8/2009 Dalena
(Continued)

FOREIGN PATENT DOCUMENTS

| KR | 10-0833624 B1 | 5/2008 |
| KR | 10-2009-0015249 A | 2/2009 |
| KR | 10-2017-0075892 A | 7/2017 |

OTHER PUBLICATIONS

An, Chang-Ho, et al. "High-speed rail-to-rail class-AB buffer amplifier with compact, adaptive biasing for FPD applications." *Electronics* vol. 9.1 Issue 2 : 2018. pp 1-9.

*Primary Examiner* — Khanh V Nguyen
(74) *Attorney, Agent, or Firm* — NSIP Law (57) ABSTRACT

An exemplary embodiment of the present disclosure relates to a rail-to-rail class-AB buffer amplifier using compact adaptive biasing, and the rail-to-rail class-AB buffer amplifier using compact adaptive biasing includes an input stage generating a differential current pair based on a voltage difference between a first input signal and a second input signal, an amplification stage outputting a driving signal based on the differential current pair, an output stage connected to the amplification stage and outputting an output signal, an auxiliary current source switch which is on/off based on the driving signal of the amplification stage, and a current mirroring unit generating bias current and outputting the generated bias current to the input stage when the auxiliary current source switch is on.

8 Claims, 6 Drawing Sheets

(58) Field of Classification Search
CPC .............. H03F 3/3022; H03F 3/45219; H03F 3/45192; H03F 1/307
USPC ........................................................ 330/255
See application file for complete search history.

(56) References Cited

U.S. PATENT DOCUMENTS

| | | | | |
|---|---|---|---|---|
| 8,044,950 | B2* | 10/2011 | Satou | G09G 3/3688 |
| | | | | 345/212 |
| 8,159,302 | B2* | 4/2012 | Yeh | H03F 3/45219 |
| | | | | 330/257 |
| 8,222,957 | B2* | 7/2012 | Kato | H03F 3/4521 |
| | | | | 330/253 |
| 9,628,034 | B2* | 4/2017 | Jeong | H03F 3/303 |
| 2008/0001662 | A1 | 1/2008 | Dalena | |

* cited by examiner

[FIG. 1]

(RELATED ART)

RAIL-TO-RAIL CLASS-AB BUFFER AMPLIFIER WITH COMPACT ADAPTIVE BIASING

CROSS-REFERENCE TO RELATED APPLICATIONS

This application claims the priority of Korean Patent Application No. 10-2021-0112571 filed on Aug. 25, 2021, in the Korean Intellectual Property Office, the disclosure of which is incorporated herein by reference.

BACKGROUND

Field

The present disclosure relates to a rail-to-rail class-AB buffer amplifier, and more particularly, to a rail-to-rail class-AB buffer amplifier which can obtain a fast slew rate by using adaptive biasing in an entire rail-to-rail input signal range without a transistor for detecting an input signal.

Description of the Related Art

In general, in the case of an integrated circuit (DDI: Display Driver IC, display drive integrated circuit or display drive chip) for driving a panel of a display device, a slew rate appears as an important factor due to an increase in load capacitance and a decrease in horizontal period according to the enlargement.

In the amplifier, the slew rate, which is a change rate at which output voltage of the amplifier may be changed to the maximum per unit time (e.g., μs), generally is a value acquired by dividing current of an input stage by compensation capacitance.

Accordingly, in order to increase the slew rate in the determined compensation capacitance, the current of the input stage should be increased.

When static bias voltage is applied to the input stage in order to increase the current of the input stage, input current increases, so the slew rate can be enhanced, but static power is increased, and as a result, power consumption increases. The increase of the static power increases total power consumption, which causes a problem of reducing the duration of a battery.

Figure 1:
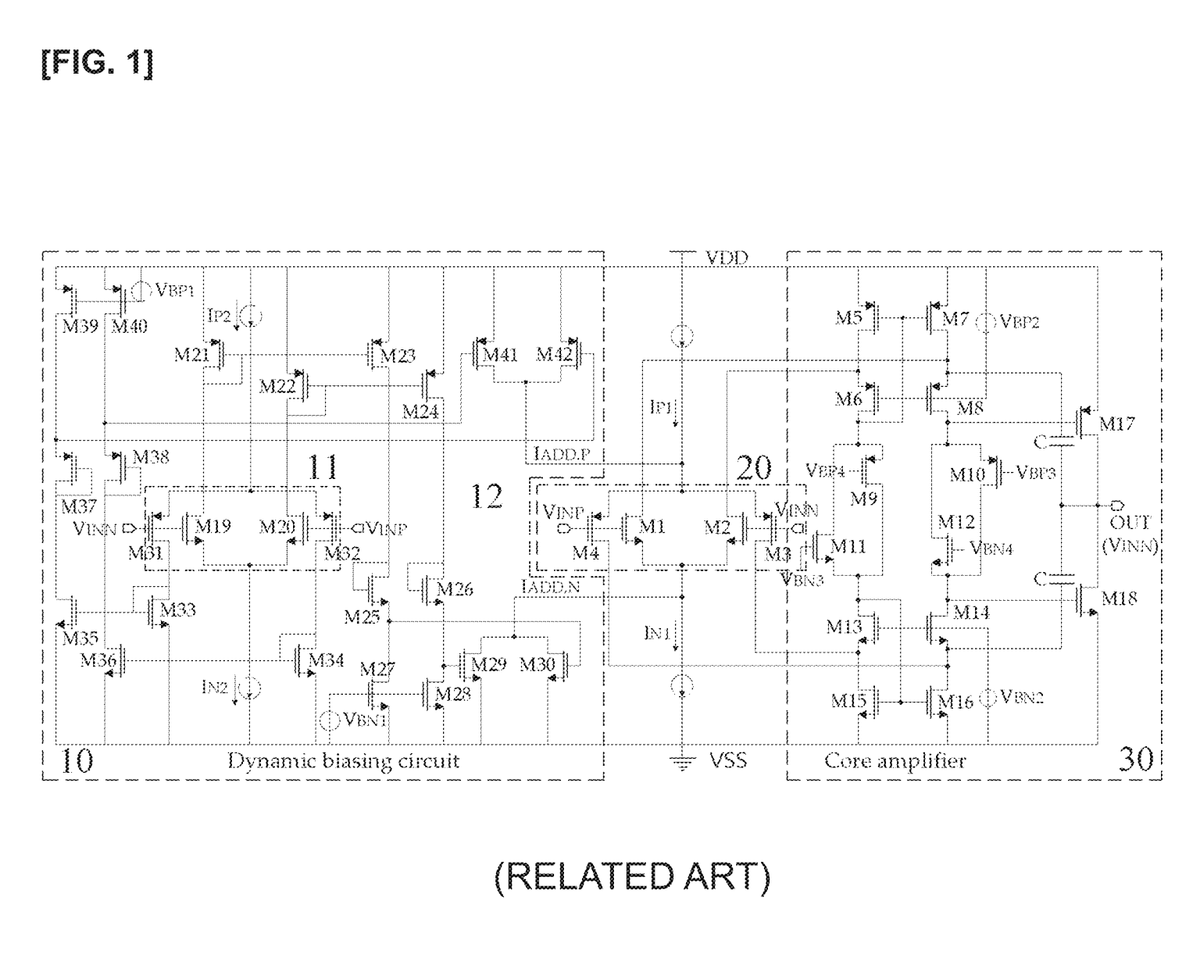
FIG. 1 is a diagram for describing a circuit configuration of a conventional rail-to-rail class-AB buffer amplifier.

Therefore, an amplifier for applying dynamic bias current illustrated in FIG. 1 is proposed.

FIG. 1 is a diagram for describing a circuit configuration of a conventional rail-to-rail class-AB buffer amplifier.

Referring to FIG. 1, the rail-to-rail class-AB buffer amplifier largely includes a dynamic bias generation unit 10, a complementary input stage 20, and a floating class-AB output stage (floating current source, class-AB control current source, and class-AB output stage) 30.

The complementary input stage 20 includes two N-type transistors M1 and M2 and two P-type transistors M4 and M3, and receives input current $I_{p1}$ from a power supply unit VDD and bias current $I_{ADD,P}$ from a bias generation unit.

The floating class-AB output stage 30 as an output stage having rail-to-rail type linearity is used for enhancing a total slew rate, and includes six N-type transistors M11, M12, M13, M14, M15, and M16 and six P-type transistors M5, M6, M7, M8, M9, and M10.

The dynamic bias generation unit 10 includes an input current determination unit 11 and a bias generation unit 12 in order to generate input current required for biasing.

The input current determination unit 11 includes two N-type transistors M19 and M20 and two P-type transistors M31 and M32 for determining a magnitude of the input current. The transistor M31 is on/off according to the voltage of $V_{INP}$(M3) and the transistor M32 is on/off according to the voltage of $V_{INP}$(M4).

The bias current generation unit 12 is on/off according to the magnitude of the input current determined by the input current determination unit 11 to generate the bias current generation unit 12.

As illustrated in FIG. 1, in a circuit of the conventional rail-to-rail class-AB buffer amplifier, the bias current generation unit 12 uses P-type slew detectors M31 and M32 in order to increase tail current of an N-type input differential pair M1 and M2 of the complementary input stage 20 and uses N-type slew detectors M19 and M20 in order to increase the tail current of a P-type input differential pair M3 and M4 in order to generate the bias current. Consequently, the slew rate of the rail-to-rail class-AB buffer amplifier can be enhanced, but power and area overhead increase. Further, since an opposite type slew detector is used in each input differential pair, there is a problem in that the buffer amplifier cannot be completely operated for an entire rail-to-rail input signal range.

SUMMARY

In order to solve the problem, according to an exemplary embodiment of the present disclosure, provided is a class-AB buffer amplifier which enhances a slew rate in an entire rail-to-rail input signal range without a transistor for detecting an input signal.

In order to achieve the object, according to an aspect of the present disclosure, there is provided a rail-to-rail class-AB buffer amplifier using compact adaptive biasing, which includes: an input stage generating a differential current pair based on a voltage difference between a first input signal and a second input signal; an amplification stage outputting a driving signal based on the differential current pair; an output stage connected to the amplification stage and outputting an output signal; an auxiliary current source switch which is on/off based on the driving signal of the amplification stage; and a current mirroring unit generating bias current and outputting the generated bias current to the input stage when the auxiliary current source switch is on.

In an exemplary embodiment, the amplification stage outputs a driving signal which is changed from nominal voltage to ground voltage according to a voltage difference between the first input signal and the second input signal.

In an exemplary embodiment, the auxiliary current source switch is a transistor, the driving signal is input into a gate of the transistor, and gate-to-source voltage increases or decreases according to the driving signal.

In an exemplary embodiment, in the transistor, as the driving signal is changed from the nominal voltage to the ground voltage, the amount of current which flows from a source to a drain increases to gradually generate large bias current.

In an exemplary embodiment, the auxiliary current source switch includes a first transistor and a second transistor, the first transistor is disposed between power supply voltage VDD and the input stage, and on/off by a first driving signal output by the amplification stage, and the second transistor is disposed between the input stage and ground voltage VSS, and on/off by a second driving signal output by the amplification stage.

In an exemplary embodiment, the rail-to-rail class-AB buffer amplifier using compact adaptive biasing further includes a main current source switch unit including a first main current source switch disposed between the power supply voltage and the input stage and a second main current source switch disposed between the input stage and the ground voltage.

In an exemplary embodiment, the current mirroring unit includes a first P-type transistor including a gate connected to the gate of the first transistor and a common node and a source connected to the power supply voltage, a first N-type transistor including a source connected to the drain of the first P-type transistor and a gate connected to the source, a second N-type transistor including a source connected to the drain of the first N-type transistor, a gate connected to the source, and a drain connected to the ground voltage, a third N-type transistor including a gate connected to the gate of the second N-type transistor and the common node, a source connected to the second transistor, and a drain connected to the ground voltage, a second P-type transistor including a source connected to the power supply voltage and a gate connected to the drain, a third P-type transistor including a source connected to the power supply voltage, a gate connected to the gate of the second P-type transistor and the common node, and a drain connected to the drain of the first transistor and the common node, a fourth P-type transistor including a source connected to the drain of the second P-type transistor and a gate connected to the drain, and a fourth N-type transistor including a source connected to the drain of the fourth P-type transistor, a gate into which the driving signal is input, and a drain connected to the ground voltage.

In an exemplary embodiment, the amplification stage is a structure of multiplexing floating bias voltage.

A rail-to-rail class-AB buffer amplifier using compact adaptive biasing according to an exemplary embodiment of the present disclosure can enhance a slew rate in an entire rail-to-rail input signal range.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly". The present disclosure may have various modifications and various exemplary embodiments and specific exemplary embodiments will be illustrated in the drawings and described in detail in the detailed description. However, this does not limit the present disclosure to specific exemplary embodiments, and it should be understood that the present disclosure covers all the modifications, equivalents and replacements included within the idea and technical scope of the present disclosure. In describing each drawing, reference numerals refer to like elements.

It should be understood that, when it is described that a component is "connected to" or "accesses" another component, the component may be directly connected to or access the other component, or a third component may be present therebetween. In contrast, when it is described that a component is "directly connected to" or "directly accesses" another component, it is understood that no element is present between the element and another element.

Terms used in the present application are used only to describe specific exemplary embodiments, and are not intended to limit the present disclosure. A singular form includes a plural form if there is no clearly opposite meaning in the context. In the present application, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

If not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

A class-AB amplifier described in this specification is an intermediate type of class A and class B and any degree of current flows even in a static state, and a magnitude of the current is very smaller than the class-A amplifier and very larger than the class-B amplifier.

Therefore, the more bias current flows, the closer the characteristics are to the class-A amplifier, and on the contrary, the less the bias current flows, the closer the characteristics are to the class-B amplifier.

In this specification, a transistor referred to as MP means a P-type transistor and a transistor referred to as MN means an N-type transistor.

Figure 2:
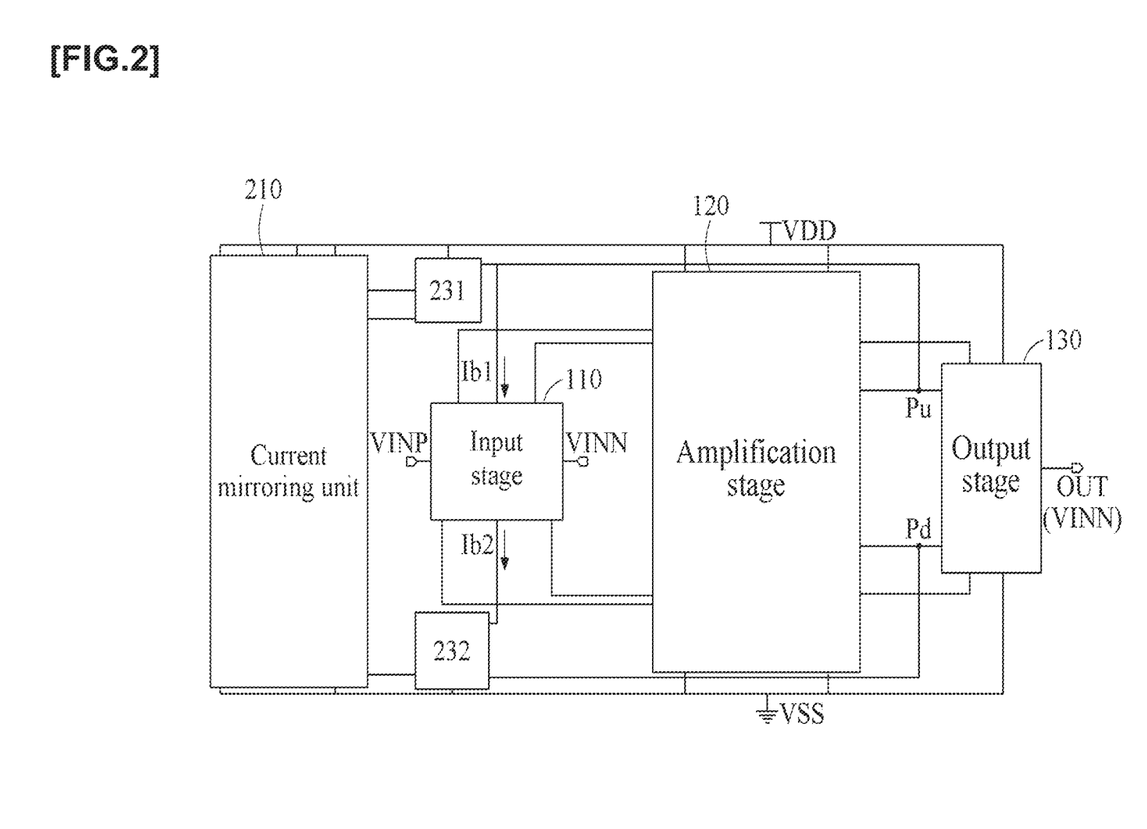
FIG. 2 is a block diagram for schematically describing a rail-to-rail class-AB buffer amplifier using compact adaptive biasing according to an exemplary embodiment of the present disclosure.

FIG. 2 is a block diagram for schematically describing a rail-to-rail class-AB buffer amplifier using compact adaptive biasing according to an exemplary embodiment of the present disclosure.

Referring to FIG. 2, the rail-to-rail class-AB buffer amplifier (hereinafter, referred to as class-AB buffer amplifier) 100 using compact adaptive biasing includes an amplification means and an adaptive bias generation means.

The amplification means includes an input stage 110, an amplification stage 120, and an output stage 130, and receives input current from a power supply, linearly amplifies and outputs the amplified input current.

The adaptive bias generation means includes a current mirroring unit 210 and auxiliary current source switch 230 (231 and 232), and generates bias current for enhancement of a slew rate based on driving signals Pu and Pd of the output stage 130. The generated bias current is transferred to the input stage 110.

The input stage 110 is connected between power supply voltage VDD and ground voltage VSS, and may convert a voltage difference between first and second input signals Vinp and Vinn into current.

The amplification stage 120 is connected between the power supply voltage VDD and the ground voltage VSS, and receives a signal from the input stage 110 and transfers the signal to the output stage 130. The amplification stage 120 includes a plurality of transistors having the same size, and amplifies the input signal and outputs the amplified input signal to the output stage 130.

The output stage 130 is connected between the power supply voltage VDD and the ground voltage VSS, and connected to the amplification stage 120 to output signals $V_{OUT}$ and $V_{NN}$ The output stage 130 as a frequency compensation unit may include two capacitors.

The current mirroring unit 210 is connected between the power supply voltage VDD and the ground voltage VSS, and generates the bias current according to on/off of the auxiliary current source switch 230 (231 and 232). The on/off of the auxiliary current source switch 230 (231 and 232) is based on the current Pu and Pd amplified by the amplification stage 120. Pu and Pd become drive current of the output stage 130.

The auxiliary current source switch 230 includes a first auxiliary current source switch 231 and a second auxiliary current source switch 232.

The first auxiliary current source switch 231 is disposed between the power supply voltage VDD and the input stage 110, and is on/off by the output current of the amplification stage 120. The second auxiliary current source switch 232 is disposed between the input stage 110 and the ground voltage VSS, and is on/off by the output current of the amplification stage 120.

Figure 3:
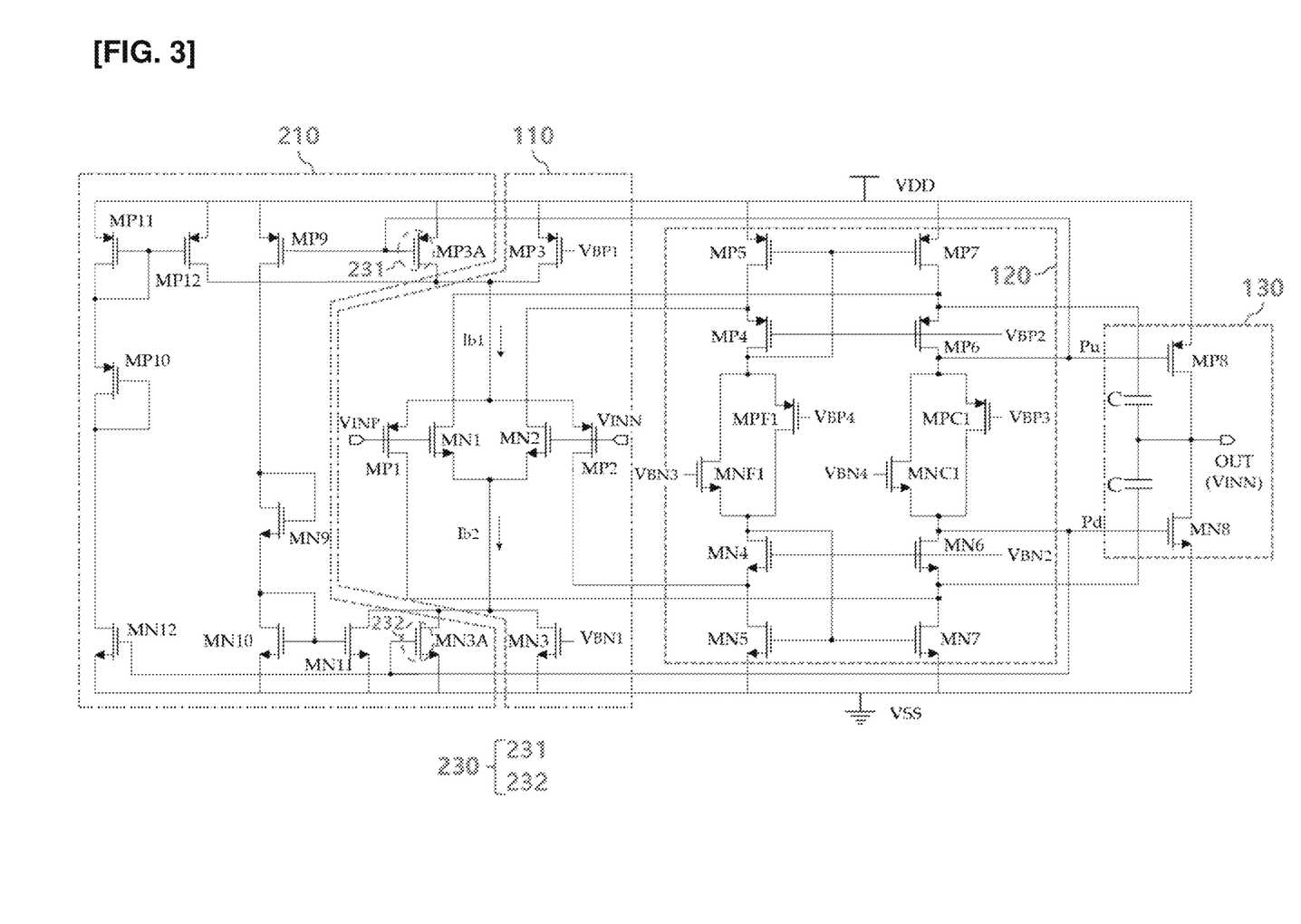
FIG. 3 is a circuit diagram for describing a detailed configuration of the rail-to-rail class-AB buffer amplifier using compact adaptive biasing illustrated in FIG. 1.

FIG. 3 is a circuit diagram for describing a detailed configuration of the rail-to-rail class-AB buffer amplifier using compact adaptive biasing illustrated in FIG. 1.

The input stage 110 may be a complementary differential amplifier. The input stage 110 includes two P-type transistors MP1 and MP2 and two N-type transistors MN1 and MN2 having a common source configuration. A drain of the first N-type transistor MN1 is connected to the drain of the transistor MP7 of the amplification stage 120 to be described below and a source is connected to the drain of the transistor MN3 to be described below to output current Ib2.

The input stage 110 further includes transistor MP3 and MN3 which operate as a main current source switch between the power supply voltage VDD and two P-type transistors MP1 and MP2. The transistor MP3 may be implemented as a PMOS transistor including a gate into which first bias voltage VBN1 is input, and a source and a drain connected between a first rail rail1 and a common source of the P-type transistors MP1 and MP2.

Here, the rail may mean a highest level (e.g., VDD, rail1) or a lowest level (e.g., VSS, rail2) of supplied power.

The amplification stage 120 may be a conventional core amplification stage illustrated in FIG. 1, which includes a plurality of transistors. The amplification stage 120 may adopt a structure of multiplexing floating bias voltage.

The amplification stage 120 includes transistors MP5, MP7, MP4, MP6, MPF1, MNF1, MPC1, MNC1, MN4, MN5, MN6, and MN7.

In each of the transistors MP5 and MP7, the source is connected to the power supply voltage VDD, the gates are connected to each other and connected to the drain of the MP4. The drain of the transistor MP5 is connected to the source of MP4, and the drain of the MP7 is connected to the source of the MP6.

The drain of the transistor MN1 of the input unit 110 is connected to a node between the source of the transistor MP6 and the drain of the MP7.

Further, a first capacitor C of the output stage 130 is connected to a node between the source of the transistor MP6 and the drain of the MP7.

The source of the transistor MP4 is connected to the drain of the MP5, and the drain is connected to the node connected to the source of a transistor MPF1 and the drain MNF1 connected in parallel. A second bias value VBP2 is input into the gate of the transistor MP4.

The drain of the transistor MN4 is connected to the node connected to the source of the transistor MPF1 and the drain of the MNF1.

The source of the transistor MN4 is connected to the drain of the transistor MN5, the source of the MN5 is connected to the ground power supply VSS, and the drain of the transistor MN4 is connected to the gate. The source of the transistor MN4 is connected to the drain of the transistor MN5. The gate of the transistor MN5 is connected to the node connected to the drain of the transistor MPF1 and the source of the MNF1 connected in parallel.

The transistor MP6 is connected to the gate of the MP4 and a second bias value VBP2 is input into the transistor MP6. The drain of the transistor MP6 is connected to the node connected to the source of a transistor MPC1 and the drain of MNC1.

A node connected to the source of the transistor MPC1 and the drain of the MNC1 connected in parallel, and the drain of the transistor MP6, and a node connected to the gate of the transistor MP8 of the output stage are connected to the gate of a transistor MP3A and the gate of the MP9 to input Pu.

The drain of the transistor MN6 is connected to the node connected to the source of the transistor MPC1 and the source of the MNC1. The gate of the transistor MN8 of the output stage is connected to a node connected to the drain of the transistor MPC1 and the source of the MNC1, and the drain of the transistor MN6.

A node connected to the drain of the transistor MPC1 and the source of the MNC1, and the drain of the transistor MN6, and a node connected to the gate of the transistor MN8 of the output stage are connected to the gate of a transistor MN3A and the gate of the MN12 to input Pd.

The gate of the transistor MN6 is connected to the gate of the transistor MN4 to be input with third bias VBN2, and the source is connected to the drain of the transistor MN7.

The gate of the transistor MN7 is connected to the gate of the transistor MN5, and the drain is connected to a node connected to the drain of the transistor MPF1 and the source of the MNF1 connected in parallel. The drains of the transistors MN5 and MN7 are connected to the ground power supply VSS.

The auxiliary current source switch 230 includes two transistors MP3A and MN3A, and MP3A and MN3A are disposed between the power supply voltage VDD and the input stage 110 and between the input stage 110 and the ground voltage VSS, respectively, and driven by the driving signals Pu and Pd for driving the transistors MP8 and MN8 included in the output stage 130.

That is, the MP3A includes a gate into which the driving signal Pu is input, a source into which the power supply voltage VDD is input, and a drain connected to the sources of the P-type transistors MP1 and MP2 of the input unit 110.

The transistor MN3A includes a drain connected to the sources of two N-type transistors MN1 and MN2, a gate into which the driving signal Pd is input, and a drain connected to the ground voltage VSS.

The transistors MP9, MN9, MN10, MN11, MN12, MP10, MP11, and MP12 for operating current mirrors of MP3A and MN3A are used for enhancing the total slew rate in the entire rail-to-rail signal range.

The transistor MN9 is a structure in which the gate is connected to the MP3A and a common node, and is driven by receiving the driving signal Pu. The source of the transistor MN9 is input with the power supply voltage VDD and the drain is connected to the drain of the transistor MN9. The gate of the transistor MN9 is connected to the drain, the source is connected to the drain of the transistor MN10, and the gate is connected to the drain and the drain is connected to the ground voltage VSS. The transistor MN11 is a structure in which the gate is connected to the transistor MN10, and an output value of the source of the transistor MN9 is input into the gate of the MN11. The drain of the transistor MN11 is connected to the input unit 110 to be input with Ib2, and the source is connected to the ground voltage VSS.

The transistor MP11 is a structure in which the source is input with the power supply voltage VDD, and the gate and the drain are connected.

The transistor MP12 is a structure in which the gate is connected to the gate of the transistor MP11 and the common node, and the drain is connected to the source of the transistor MP10 of the amplification stage.

The transistor MP10 is a structure in which the source is connected to the drain of the transistor MP11, and the gate and the drain are connected.

The drain of the transistor MN12 is connected to the drain of the transistor MP10, the driving signal Pd is input into the gate, and the source is connected to the ground voltage VSS.

The transistors MN9 and MN10 are used for decreasing static current by lowering drain and gate voltages of the current mirror transistors MN10, MN11, MP11 and MP12, and static current of a common source amplifier while the transistors MP9 and MN12 operate as a tail current source, respectively.

Thereafter, outputs of MP3 and MN3 which are main current sources and outputs of MP3A and MN3A which are auxiliary current sources are combined. As a result, the slew rate is enhanced. Magnitudes of MP3A and MN3A which are the auxiliary current sources are approximately 40 times smaller than the magnitudes of the transistors MP8 and MN8 of the output stage 130. Further, when a width of the transistor gradually decreases, threshold voltage of an MOS transistor increases due to a narrow width effect, and threshold voltages of MP3A and MN3A become higher than the threshold voltages of MP8 and MN8 of the output stage 130 in a normal state. Such an effect allows the bias currents of MP3A and MN3A to be much smaller than the currents of MP8 and MN8.

For example, in DC 8.5 V=VDD/2 @VDD=17 V, in the case of the magnitudes of MP3A and MN3A, the threshold voltages are 937 and 964 mV. However, in the case of the magnitudes of MP8 and MN8, the threshold voltages are made to 808 and 831 mV, and the threshold voltages of MP3A and MN3A are generated, which are higher than the threshold voltages of MP8 and MN8 by approximately 130 mV. Now, the bias voltages of the driving signals Pu and Pd are set to VDD 888 and 910 mV, respectively, to be higher than the threshold voltages of MP8 and MN8 and lower than the threshold voltages of MP3A and MN3A. As a result, bias current of approximately 5 nA is generated for MP3A and MN3A, and this is a level which may be disregarded as compared with bias currents of MP3/MN3 (1.6 µA), MP5/MN5 (2.1 µA), MP7/MN7 (2.1 µA) and MP8/MN8 (5.6 µA). As such, total bias current of the amplifier does not almost increase in the normal state.

When an operation principle is described, when there is a voltage swing in an input, the voltages of Pu ad Pd increases or decreases according to an input polarity, so gate-to-source voltage ($V_{GS}$) of MP3A and MN3A increases or decreases. When an input voltage difference is very large, the voltage of Pu (Pd) may be changed from a nominal value (ground) to the ground (VDD). Then, the amount of current which flows through MP3A and MN3A significantly increases, so larger bias current is generated for enhancement of the slew rate only during ascending and descending transition operations of the buffer amplifier. When input swing $V_{INP}$ is small, voltage changes of Pu and Pd are small, so MP3A and MN3A have low current. Further, when the input voltage swing becomes large, Pu and Pd have a large voltage difference, so MP3A and MN3A draw higher current to bring a faster response. When in an ascending transition of the input and output voltage swing, the voltage of the node Pu is low and in a descending transition, the voltage of the node Pd is high, auxiliary adaptive tail current increases to obtain a faster response. The voltages of the nodes Pu and Pd provide a higher level according to a larger capacitive load and a larger input excessive voltage swing. The buffer amplifier has an excellent driving ability when the capacitive load is larger and the voltage swing of the input excessive response is higher.

The rail-to-rail class-AB buffer amplifier using compact adaptive biasing according to an exemplary embodiment of the present disclosure can enhance the slew rate upon full-swing transition for high voltage like the conventional buffer amplifier. Further, the rail-to-rail class-AB buffer amplifier of the present disclosure generates the bias current only by 12 transistors (the current switches MP3 and MN3, the auxiliary current source switches 231 and 232, and 8 transistors MP9, MN9, MN10, MN11, MN12, P10, MP11 and MP12 of the current mirroring unit 210). Meanwhile, since the conventional rail-to-rail class-AB buffer amplifier illustrated in FIG. 1 generates the bias current by using 26 transistors, the rail-to-rail class-AB buffer amplifier of the present disclosure is high in area efficiency, so miniaturization is possible and power consumption is reduced.

Figure 4A:
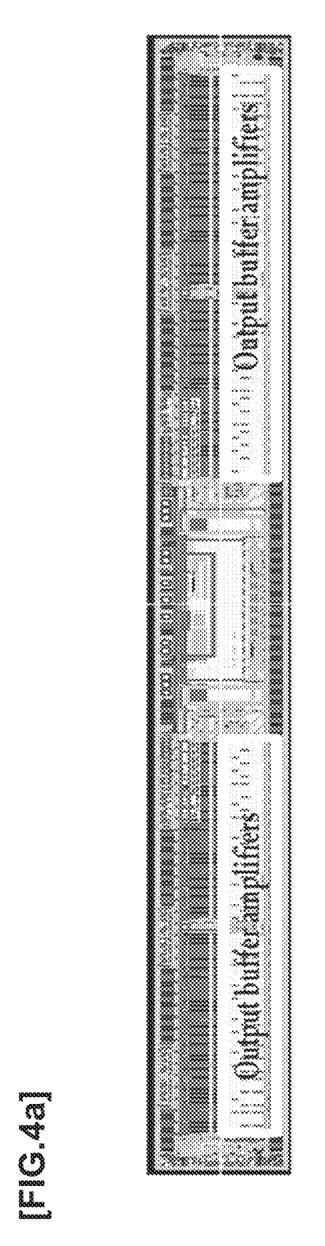
FIG. 4A illustrates a layout of a column driver IC including the rail-to-rail class-AB buffer amplifier using compact adaptive biasing according to an exemplary embodiment of the present disclosure and FIG. 4B is a graph showing an output waveform measured for full-swing.
Figure 4B:
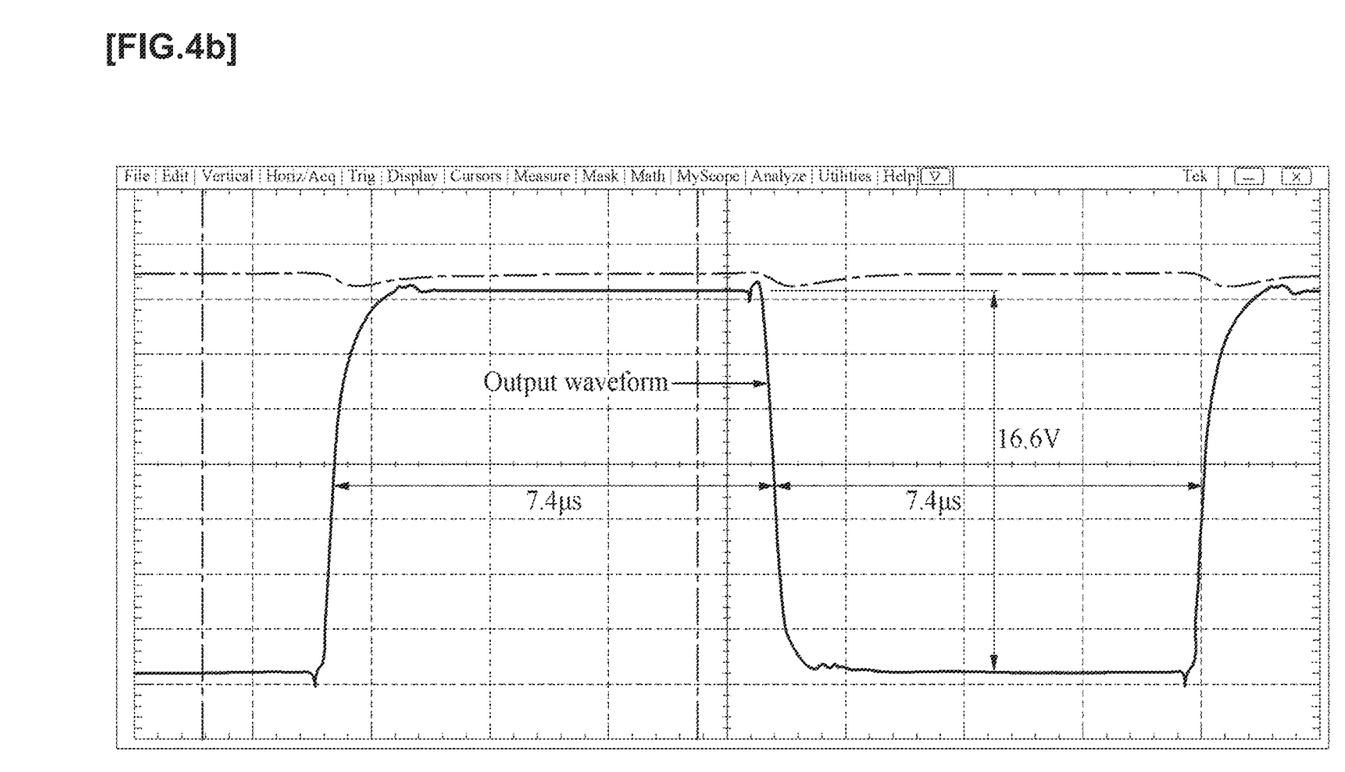

FIG. 4A illustrates a layout of a column driver IC including the rail-to-rail class-AB buffer amplifier using compact adaptive biasing according to an exemplary embodiment of the present disclosure. FIG. 4B is a graph showing an output waveform measured for full-swing. In addition, FIG. 5 is a graph showing simulated output waveforms of the class-AB buffer amplifier according to an exemplary embodiment of the present disclosure and a conventional class-AB buffer amplifier.

The class-AB buffer amplifier according to an exemplary embodiment of the present disclosure may be applied to a large panel display (FPD), and a column driver IC including the buffer amplifier is designed and manufactured by using 1.6 μm 18V CMOS technology. In FIG. 4A, the active area occupies 12,685 μm² × 1010 μm². In FIG. 4B, a fast response of the class-AB buffer amplifier may be identified through an output waveform measured for a white pattern (full-swing) in dot reversal. A stabilization operation may be identified through FIG. 5.

Figure 5:
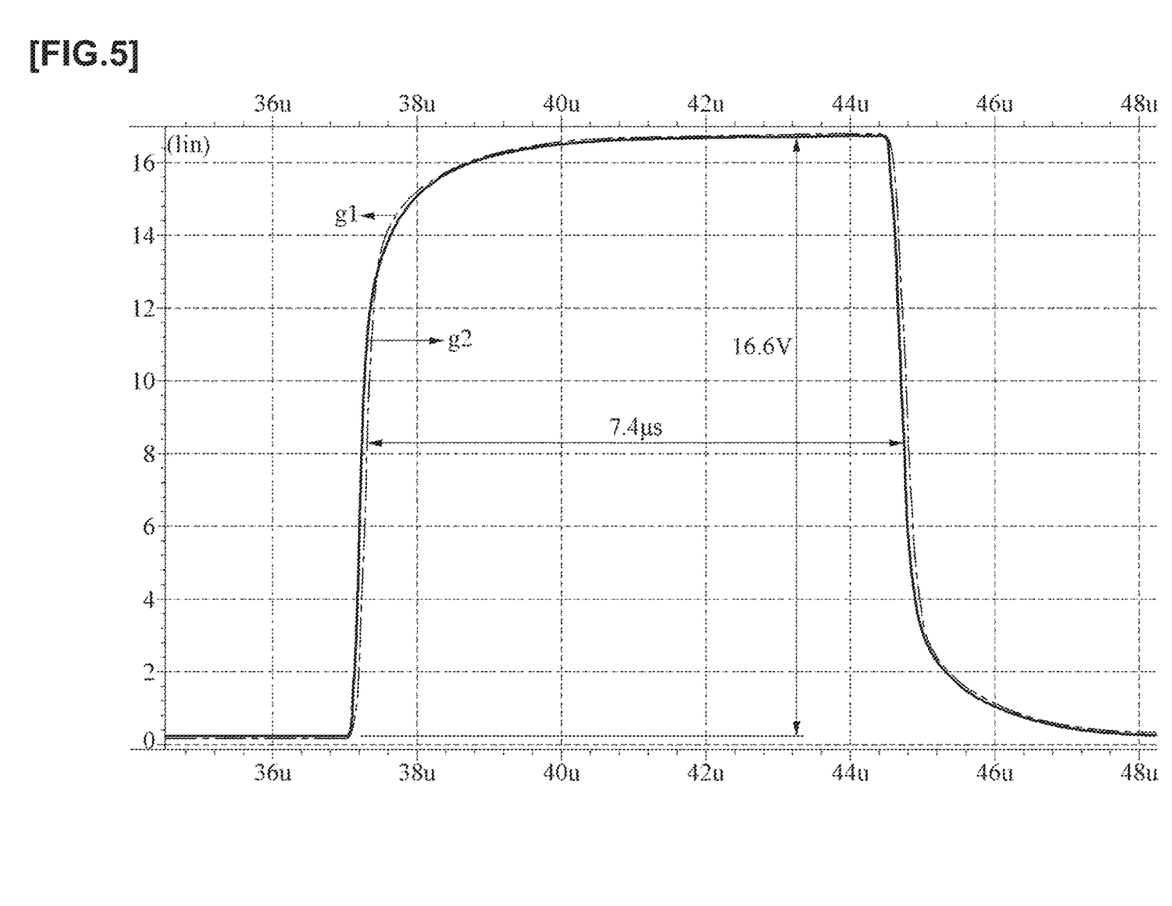
FIG. 5 is a graph showing simulated output waveforms of the class-AB buffer amplifier according to an exemplary embodiment of the present disclosure and a conventional class-AB buffer amplifier.

A simulation condition in FIGS. 4 and 5 is that the buffer amplifier similarly drives resistance of 8.5 KΩ and capacitance of 300 pF with a column line load of a 55-inch TFT-LCD panel in voltage swing of 0.2 V to 16.8 V. As can be seen through FIG. 5, a stabilization time for ascending and descending transition of the class-AB buffer amplifier according to an exemplary embodiment is similar to that of the buffer amplifier in FIG. 1. Meanwhile, the class-AB buffer amplifier according to an exemplary embodiment uses even smaller static current than the buffer amplifier of FIG. 1.

Tables 1 and 2 are tables showing performance matrices such as the static current, the dynamic current, the stabilization time, and the active area based on experimental measurement results of the class-AB buffer amplifier according to an exemplary embodiment of the present disclosure and the conventional class-AB buffer amplifier of FIG. 1.

TABLE 1

| Parameter | Conventional Measured | Exemplary embodiment Measured |
|---|---|---|
| CMOS Technology (μm) | 0.35 | 0.18 (1P3M) |
| Power supply (V) | 3.3 | 1.8/9/18 |
| Gray Scale (bits) | — | 8 |
| Static current (μA) | 5.8 | 11.40 |
| Driving voltage (V) | 3.3 | DC 8.5 @17 |
| Dynamic current (μA) | — | 371 |
| Settling time (μs, 90% rising) | — | 0.91 |
| Settling time (μs, 90% falling) | — | 0.95 |
| Settling time (μs, 99.9% rising) | — | 3.11 |

TABLE 1-continued

| Parameter | Conventional Measured | Exemplary embodiment Measured |
|---|---|---|
| Settling time (μs, 99.9% falling) | — | 3.04 |
| Active area (μm²) | — | 31 × 160 |
| Loads | C = 200 pF | R = 8.5 KΩ, C = 300 pF |
| Conditions | VDD = 3.3 V | VDD = 17 V, Ta = 25° C., Period = 7.4 μs, 0.2-16.8 V |

TABLE 2

| Parameter | Conventional Simulated | Conventional Simulated | Exemplary embodiment Measured |
|---|---|---|---|
| CMOS Technology (μm) | | 0.18 (1P3M) | |
| Power supply (V) | | 1.8/9/18 | |
| Gray Scale (bits) | | 8 | |
| Static current (μA) | 18.86 | 11.45 | 11.40 |
| Driving voltage (V) | | DC 8.5 (VDD/2) @17 | |
| Dynamic current (μA) | 415 | 389.4 | 371 |
| Settling time (μs, 90% rising) | 1.031 | 0.989 | 0.91 |
| Settling time (μs, 90% falling) | 1.022 | 0.991 | 0.95 |
| Settling time (μs, 99.9% rising) | 3.416 | 3.404 | 3.11 |
| Settling time (μs, 99.9% falling) | 3.377 | 3.305 | 3.04 |
| Slew-rate (V/μs, 90% rising) | 14.490 | 15.106 | 16.417 |
| Slew-rate (V/μs, 90% falling) | 14.618 | 15.075 | 15.726 |
| Slew-rate (V/μs, 99.9% rising) | 4.859 | 4.876 | 5.401 |
| Slew-rate (V/μs, 99.9% falling) | 4.921 | 5.022 | 5.526 |
| Active area (μm²) | 31 × 271 | 31 × 160 | 31 × 160 |
| Loads | | R = 8.5 KΩ¹, C = 300 pF¹ | R = 8.5 KΩ, C = 300 pF |
| Conditions | | VDD = 17 V, Ta = 25° C., Period = 7.4 μs, 0.2 V-16.8 V | |

As can be seen through Tables 1 and 2, the class-AB buffer amplifier according to an exemplary embodiment of the present disclosure shows a similar slew rate to the conventional class-AB buffer amplifier in FIG. 1, but uses even smaller static current than the conventional class-AB buffer amplifier in FIG. 1.

As shown in Table 2, it can be seen that in a 2 gm area of the input stage in which the most DC stand-by current is consumed, the static current of the class-AB buffer amplifier according to an exemplary embodiment of the present disclosure is reduced from 18.86 μA to 11.44 μA (reduced by 39.3%) as compared with the conventional class-AB buffer amplifier in FIG. 1 to provide similar stabilization performance.

It can be seen that the active area of the class-AB buffer amplifier according to an exemplary embodiment of the present disclosure is reduced from 8401 to 4960 μm2 by approximately 40.9% as compared with the conventional class-AB buffer amplifier in FIG. 1.

Since the class-AB buffer amplifier according to an exemplary embodiment of the present disclosure may achieve slew rate enhancement even more efficiently by using a smaller number of transistors, the class-AB buffer amplifier has higher area efficiency, brings lower power consumption, and enables fast stabilization. The class-AB buffer amplifier according to an exemplary embodiment is suitable as a large high-definition FPD column driver.

The above description just illustrates the technical spirit of the present disclosure and various changes and modifications can be made by those skilled in the art to which the present disclosure pertains without departing from an essential characteristic of the present disclosure. Accordingly, various exemplary embodiments executed in the present disclosure are not intended to limit the technical spirit but describe the present disclosure and the technical spirit of the present disclosure is not limited by the following exemplary embodiments. The protective scope of the present disclosure should be construed based on the following claims, and all the technical concepts in the equivalent scope thereof should be construed as falling within the scope of the present disclosure.

What is claimed is:

1. A rail-to-rail class-AB buffer amplifier using compact adaptive biasing, the rail-to-rail class-AB buffer amplifier comprising:
    an input stage configured to generate a differential current pair based on a voltage difference between a first input signal and a second input signal;
    an amplification stage configured to output a driving signal based on the differential current pair;
    an output stage connected to the amplification stage and configured to output an output signal;
    an auxiliary current source switch which is configured to be on/off based on the driving signal output by the amplification stage; and
    a current mirroring unit configured to generate dynamic bias current and output the generated dynamic bias current to the input stage based on the auxiliary current source switch being on,
    wherein the auxiliary current source switch comprises a transistor, and
    wherein the driving signal is directly input into a gate of the transistor.

2. The rail-to-rail class-AB buffer amplifier of claim 1, wherein the amplification stage is configured to output the driving signal which is changed from nominal voltage to ground voltage based on a voltage difference between the first input signal and the second input signal.

3. The rail-to-rail class-AB buffer amplifier of claim 1, wherein gate-to-source voltage increases or decreases based on the driving signal.

4. The rail-to-rail class-AB buffer amplifier of claim 3, wherein in the transistor, as the driving signal is changed from the nominal voltage to the ground voltage, the amount of current which flows from a source to a drain increases to gradually increase the dynamic bias current.

5. The rail-to-rail class-AB buffer amplifier of claim 1, wherein the transistor comprises a first transistor and a second transistor,
    wherein the first transistor is disposed between power supply voltage VDD and the input stage, and turned on/off by a first driving signal output by the amplification stage, and
    wherein the second transistor is disposed between the input stage and ground voltage VSS, and turned on/off by a second driving signal output by the amplification stage.

6. The rail-to-rail class-AB buffer amplifier of claim 1, further comprising:
    a main current source switch unit including a first main current source switch disposed between the power supply voltage,
    wherein the input stage and a second main current source switch are disposed between the input stage and the ground voltage.

7. The rail-to-rail class-AB buffer amplifier of claim 5, wherein the current mirroring unit includes:
    a first P-type transistor including a gate connected to the gate of the first transistor and a common node and a source connected to the power supply voltage;
    a first N-type transistor including a drain connected to the drain of the first P-type transistor and a gate connected to the drain;
    a second N-type transistor including a drain connected to the source of the first N-type transistor, a gate connected to the drain, and a source connected to the ground voltage;
    a third N-type transistor including a gate connected to the gate of the second N-type transistor and the common node, a drain connected to the drain of the second transistor, and a drain source connected to the ground voltage;
    a second P-type transistor including a source connected to the power supply voltage and a gate connected to the drain;
    a third P-type transistor including a source connected to the power supply voltage, a gate connected to the gate of the second P-type transistor and the common node, and a drain connected to the drain of the first transistor and the common node;
    a fourth P-type transistor including a source connected to the drain of the second P-type transistor and a gate connected to the drain; and
    a fourth N-type transistor including a drain connected to the drain of the fourth P-type transistor, a gate into which the driving signal is input, and a source connected to the ground voltage.

8. The rail-to-rail class-AB buffer amplifier of claim 1, wherein the amplification stage comprises a structure for multiplexing floating bias voltage.

* * * * *